United States Patent
Hay (10) Patent No.: US 8,141,374 B2
(45) Date of Patent: Mar. 27, 2012

(54) MULTI-MODE COOLING SYSTEM AND METHOD WITH EVAPORATIVE COOLING

(75) Inventor: Jonathan David Hay, Kirkland, WA (US)

(73) Assignee: Amazon Technologies, Inc., Reno, NV (US)

( * ) Notice: Subject to any disclaimer, the term of this patent is extended or adjusted under 35 U.S.C. 154(b) by 579 days.

(21) Appl. No.: 12/341,137

(22) Filed: Dec. 22, 2008

(65) Prior Publication Data

US 2010/0154448 A1 Jun. 24, 2010

(51) Int. Cl.
  *F25B 7/00* (2006.01)
  *F28D 3/00* (2006.01)
(52) U.S. Cl. .......................... 62/175; 62/171
(58) Field of Classification Search .............. 62/175, 62/171, 119, 311, 333; 361/690
  See application file for complete search history.

(56) References Cited

U.S. PATENT DOCUMENTS

| | | | |
|---|---|---|---|
| 4,446,703 A | 5/1984 | Gilbertson |
| 4,698,979 A | 10/1987 | McGuigan |
| 6,141,986 A | 11/2000 | Koplin |
| 6,223,545 B1 | 5/2001 | Kinkel et al. |
| 6,681,584 B1 | 1/2004 | Conner |
| 7,010,392 B2 | 3/2006 | Bash et al. |
| 7,197,433 B2 | 3/2007 | Patel et al. |
| 7,278,273 B1 | 10/2007 | Whitted et al. |
| 2003/0158718 A1 | 8/2003 | Nakagawa et al. |
| 2005/0228618 A1 | 10/2005 | Patel et al. |
| 2007/0101746 A1 | 5/2007 | Scholm et al. |
| 2008/0029250 A1 | 2/2008 | Carlson et al. |
| 2008/0055846 A1 | 3/2008 | Clidaras et al. |
| 2008/0094797 A1 | 4/2008 | Coglitore et al. |
| 2008/0148746 A1 | 6/2008 | Yanik et al. |
| 2008/0259566 A1 | 10/2008 | Fried |
| 2008/0288193 A1 | 11/2008 | Classen et al. |

OTHER PUBLICATIONS

U.S. Appl. No. 11/535,180, filed Sep. 26, 2006.
U.S. Appl. No. 12/163,146, filed Jun. 27, 2008.
U.S. Appl. No. 11/956,849, filed Dec. 14, 2007.
International Search Report and Written Opinion from PCT/US 09/69154 mailed Apr. 13, 2010, 8 pages.

*Primary Examiner* — Chen Wen Jiang
(74) *Attorney, Agent, or Firm* — Robert C. Kowert; Meyertons, Hood, Kivlin, Kowert & Goetzel, P.C.

(57) ABSTRACT

A air channeling sub-system may include a mechanical cooling section and a direct evaporative cooling section. The direct evaporative cooling section may be downstream from the mechanical cooling section. Cooling air is channeled through the air channeling sub-system and into the room. If a first set of control conditions is met, the air channeling sub-systems is operated in an adiabatic mode. The adiabatic mode includes channeling cooling air through the direct evaporative cooling section to evaporate water into the cooling air. If a second set of control conditions is met, the air channeling sub-system is operated in a hybrid mode. The hybrid mode includes channeling cooling air through the mechanical cooling section to remove heat from the cooling air and channeling the cooling air through the direct evaporative cooling section to evaporate water into the cooling air.

38 Claims, 8 Drawing Sheets

MULTI-MODE COOLING SYSTEM AND METHOD WITH EVAPORATIVE COOLING

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

Some data centers use outside air as an important source of cooling air. The characteristics and quality of outside air may vary widely, however, even at a given location. Aside from the significant changes in temperature and humidity that can occur with the change of seasons, environmental quality of the outside air may vary due to a myriad of external factors. For example, smoke, smog, and airborne by-products of industrial and/or agricultural activities can all affect usability of outside air for cooling purposes. These variations over time in availability, cooling capacity, and quality of outside air create challenges in effectively sizing and operating cooling air systems for a data center. For example, a mechanical cooling system that is sized for cooler, drier times of year may fail to provide adequate cooling in hot, humid weather. Conversely, a mechanical cooling system that is sized to provide effective cooling during hot, humid summer months may result in a system that is significantly oversized for cooler, drier times of year.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for cooling electronic equipment in a data center are disclosed. According to one embodiment, a method for cooling computer systems in a room of a data center includes providing an air channeling sub-system. The air channeling sub-system includes a mechanical cooling section and a direct evaporative cooling section. Cooling air is channeled through the air channeling sub-system and into the room. If a first set of control conditions is met, the air channeling sub-system is operated in an adiabatic mode. The adiabatic mode includes channeling cooling air through the direct evaporative cooling section to evaporate water into the cooling air. If a second set of control conditions is met, the air channeling sub-system is operated in a hybrid mode. The hybrid mode includes channeling cooling air through the mechanical cooling section to remove heat from the cooling air and channeling the cooling air through the direct evaporative cooling section to evaporate water into the cooling air. In one embodiment, the first set of control conditions is met, and the system is operated in adiabatic mode, if the measured ambient air temperature is at or above an ambient air temperature maximum set point and the supply air enthalpy is at or below a supply air enthalpy set point. The second set of control conditions is met, and the system is operated in hybrid mode, if the measured ambient air temperature is at or above the ambient air temperature maximum set point and the supply air enthalpy is above the supply air enthalpy set point.

In certain embodiments, the air channeling sub-system may be operated in an economizer mode if a third set of control conditions is met. Operating in the economizer mode may include channeling cooling air through the direct evaporative cooling section to evaporate water into the cooling air, and controlling a humidity of supply air to the data room by controlling an amount of water evaporated into the cooling air in the direct evaporative cooling section. In one embodiment, the third set of control conditions is met, and the system is operated in economizer mode, if the measured ambient air temperature is below an ambient temperature minimum set point and the supply air enthalpy is below a supply air enthalpy set point.

In certain embodiments, the air channeling sub-system may be operated in a free cooling mode if a fourth set of control conditions is met. Operating in the free cooling mode may include channeling air from the outside through the room while the mechanical cooling section and the direct evaporative cooling section are shut down or inhibited from operation, and exhausting air from the room to the outdoors. In one embodiment, the fourth set of control conditions is met if the ambient air temperature is within a desired temperature control band.

In certain embodiments, the air channeling sub-system may be operated in a mechanical mode if a fifth set of control conditions is met. Operating in the mechanical mode may include channeling cooling air through the mechanical cooling section to remove heat from the cooling air. The cooling air may be recirculated from the room through the air channeling sub-system. In one embodiment, the fifth set of control conditions is met if the measured ambient temperature is above an ambient temperature maximum set point, the ambient relative humidity is above an ambient relative humidity set point, and the supply air enthalpy is above an enthalpy set point. In another embodiment, the fifth set of control conditions is met if the outside air is unusable.

According to one embodiment, a system for cooling computer systems in a room of a data center includes an air channeling sub-system. The air channeling sub-system includes a mechanical cooling section that removes heat from the cooling air and a direct evaporative cooling section downstream from the mechanical cooling section. A controller selectively operates the mechanical cooling section and the direct evaporative cooling section in an adiabatic mode if a first set of control conditions is met and in a hybrid mode if a second set of control conditions is met.

According to one embodiment, a system for cooling computer systems in a room of a data center includes an air channeling sub-system that provides cooling air to electronic equipment in the data center. The air channeling sub-system includes a direct evaporative cooling section that evaporates water into the cooling air. The air channeling sub-system includes a bypass duct to channel the cooling air to bypass the direct evaporative cooling section, and one or more dampers configurable to direct at least a portion of the cooling air through the bypass duct instead of the direct evaporative cooling section.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, "evaporative cooling" means cooling of air by evaporation of liquid.

As used herein, "direct evaporative cooling" means cooling of air by evaporation of liquid directly into a stream of air to be cooled.

As used herein, "adiabatic system" means a system that cools by evaporation of a liquid.

As used herein, "ambient" refers to a condition of outside air at the location of a system or data center. An ambient temperature may be taken, for example, at or near an intake hood of an air handling system.

As used herein, a "free cooling mode" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

In various embodiments, a cooling system for a data center may include a multi-stage cooling arrangement. In one embodiment, the multi-stage arrangement may include a mechanical cooling system and a direct evaporative cooling system downstream from the mechanical cooling system. A cooling system that includes both a mechanical cooling system and a direct evaporative cooling system may allow a design in which each system has a smaller capacity than a system having only a mechanical cooling system or only an evaporative cooling system.

Figure 1:
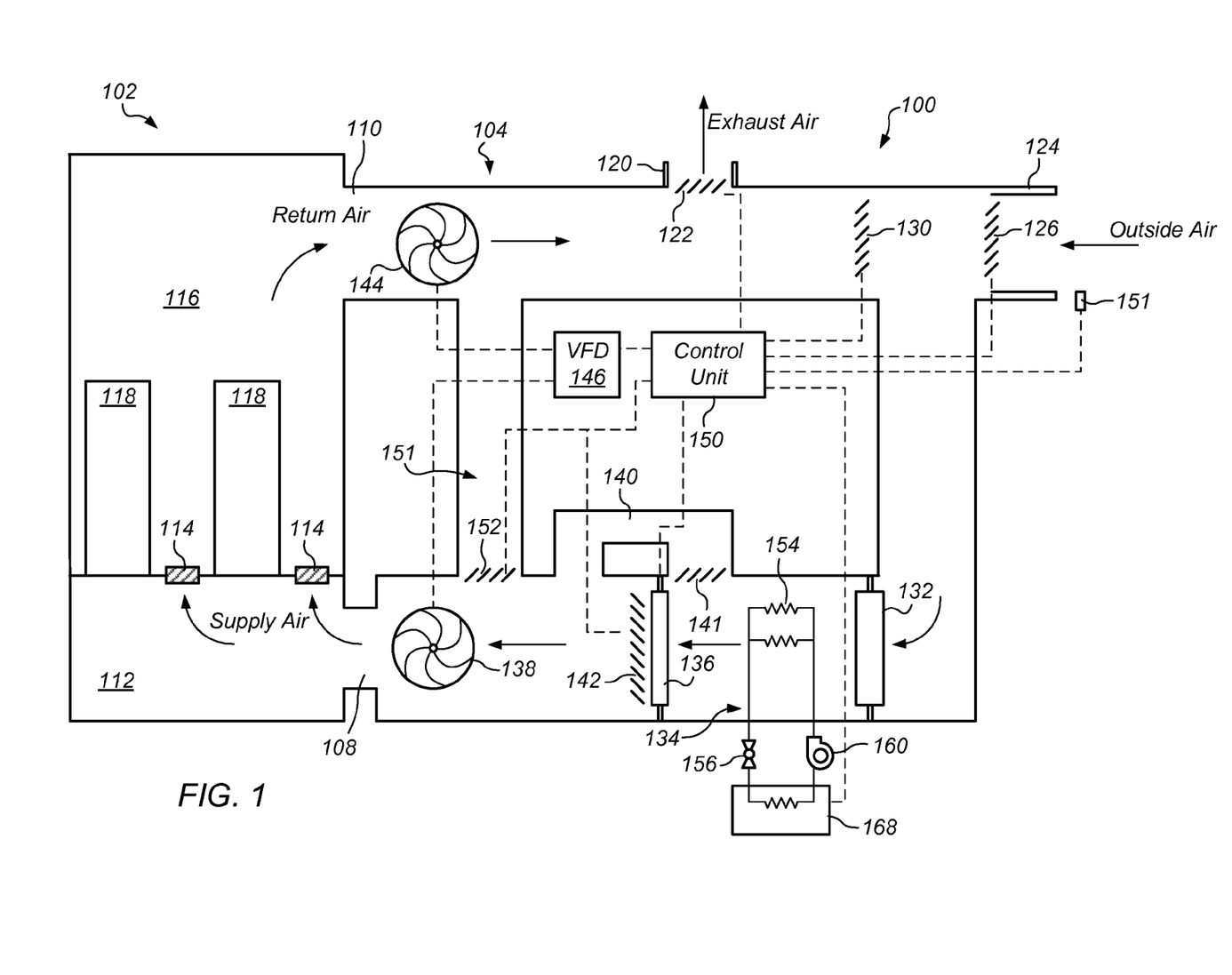
FIG. 1 is a schematic diagram illustrating one embodiment of a data center cooling system including a mechanical system and an adiabatic system.

FIG. 1 is a schematic view of an embodiment of a data center cooling system including a mechanical cooling section and a direct evaporative cooling section. Cooling system 100 may remove heat from computer systems operating in data center 102. In the embodiment illustrated in FIG. 1, cooling system 100 includes air handling sub-system 104. Air handling sub-system 104 may channel cooling air to data center 102.

The number of air handling sub-systems 104 in cooling system 100 may vary. In some embodiments, cooling system 100 includes many air handling sub-systems 104. In one embodiment, cooling system 100 may include four air handling sub-systems 104. In another embodiment, cooling system 100 includes only one air handling sub-system 104. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center are provided with outside air vents. For example, half the air handling systems at a data center may have both outside air vents and return air vents, while the other half the air handling systems at a data center have only return air vents.

Each air handling sub-system 104 may be coupled to data center 102 by supply duct 108 and return duct 110. Cooling air may flow from air handling sub-system 104 through supply duct 108 into plenum 112. From plenum 112, cooling air may pass through flow restriction devices 114 into room 116. Cooling air may pass over racks 118. After the air is heated by racks 118, the air may pass through return duct 110. Air may be recirculated through one or more air handling sub-systems or discharged from the system through exhaust vent 120. Exhaust vent 120 includes exhaust damper 122.

Air for cooling system 100 may be drawn from outside air, recirculated air, or a combination of outside air and recirculated air. Air handling sub-system 104 includes outside air vent 124. Outside air vent includes outside air damper 126. Air handling sub-system 104 includes mixing air damper 130.

Cooling system 100 includes filter bank 132, chilled water sub-system 134, evaporative cooler 136, and supply fan 138, and return fan 144. In one embodiment, filter bank 132 includes a series of four filters. Cooling system 100 includes bypass duct 140. Bypass duct 140 may allow for all or a portion of the supply air to bypass evaporative cooler 136. Evaporative cooler bypass damper 141 and evaporative cooler face damper 142 may be selectively positioned to control flow through evaporative cooler 136. Cooling system 100 includes return air bypass 151 and return air bypass damper 152.

Supply fan 138 and return fan 144 are coupled to VFDs 146. VFD 146 is coupled to control unit 150.

Chilled water subsystem 134 is coupled in heat transfer communication with air handling sub-systems 104. Chilled water sub-system 134 includes coils 154 and valve 156. Valve 156 is coupled to control unit 150. Valve 156 may be opened and closed by signals from control unit 150. The position of valve 156 may be used to regulate the use of chilled water to cool air in air handling sub-system 104. In one embodiment, a common chilled water subsystem 134 provides chilled water to two more air handling sub-systems. In certain embodiments, each air handling sub-system is cooled by a dedicated chilled water subsystem 134.

Chilled water sub-system 134 includes at least one pump 160 coupled in flow communication with a flow control valve 156. Valve 156 is coupled in flow communication with coils 154 such that chilled water flow through coils 154 is facilitated while air flows across coils 154. Coils 154 are coupled in flow communication with at least one chilled water heat exchanger 162 via a plurality of tubes that are coupled in flow communication with pump 160.

Cooling system 100 further includes a chilled water heat removal sub-system 168. Heat removal sub-system 168 may be any sub-system that facilitates operation of system 100. In one embodiment, heat removal sub-system 168 is an air-conditioning refrigerant sub-system. In another embodiment, heat removal sub-system 168 is a cooling tower sub-system. In still another embodiment, heat removal sub-system 168 is a service water sub-system. In certain embodiments, a mechanical cooling system such as an air-conditioning refrigerant system may be in direct heat transfer communication with cooling air in air handling sub-systems 104. For example, evaporator coils of an air conditioning system may be positioned downstream from filter bank 132.

Control unit 150 may be programmed to control devices in air handling sub-systems 102, chilled water sub-systems 134, and/or heat removal sub-systems. Control unit 150 is coupled to supply fan 138, return fan 144, outside air damper 126, exhaust damper 122, and mixing air damper 130. Control unit 150 is in data communication with temperature sensors, humidity sensors, and pressures sensors. For example, control unit 150 is in data communication with temperature sensor 151 located near the intake hood of cooling system 100. In one embodiment, all of the air handling sub-systems and chilled-water sub-systems at a data center are controlled with a common control unit. In other embodiments, separate controllers are provided for each air handling sub-system and chilled water sub-systems, or for a subset of the air handling sub-systems and/or chilled water sub-systems. Devices in air handling sub-systems and chilled water sub-systems may be controlled automatically, manually, or a combination thereof.

In certain embodiments, control unit 150 includes at least one programmable logic controller. The PLC may, among other things, open and close dampers in air handling system 104 based upon command signals from an operator to channel air flow through data center 102 as necessary for the prevailing operational conditions. Alternatively, the PLC may modulate dampers between fully open and fully closed positions to modulate airflow.

Cooling system 100 also includes a plurality of temperature measurement devices that, in one embodiment, are thermocouples. Alternatively, the temperature measurement devices include, but not be limited to, resistance temperature detectors (RTDs) and any device that facilitate operation of cooling system 100 as described herein. For example, a chilled water thermocouple may be positioned within chilled water subsystem 138 to facilitate measuring a temperature of the chilled water upon discharge from a heat exchanger. In the one embodiment, such chilled water temperatures are controlled to approximately 5.6 degrees Celsius (° C.) (42 degrees Fahrenheit (° F.)).

In the embodiment shown in FIG. 1, air handling sub-system 104 may force air through supply duct 108 into plenum 112. In other embodiments, cooling air may be forced directly into room 116 through a supply duct without going through a plenum. In various embodiments, flow restriction devices 114 may be chosen to control the flow rates and distribution of cooling air among various racks 118 in room 116.

In various embodiments, operation of one or more air handling sub-systems of a cooling system may be controlled in response to one or more conditions. For example, the controller may be programmed to switch the air source for an air-handling sub-system from return air to outside air when one or more predetermined conditions are met, such as temperature and humidity.

In various embodiments, a cooling system for a data center may be operated in two or more different modes. The mode of operation at any given time may be selected based on characteristics of the outside air, characteristics of air in various locations in the cooling system, and other characteristics prevailing at or near the data center. In various embodiments, the multi-mode cooling system may minimize the amount of energy required to cool a data center. The multi-mode system may allow for a more efficient use of components of a cooling air system, allow for a reduction is size/capacity of one or more elements of the system, reduce operating costs of a cooling system, and/or improve cooling effectiveness (such as through lower operating temperatures of computer systems in the data center).

In some embodiments, a multi-mode cooling system includes an adiabatic system and a mechanical cooling section. The adiabatic system may be, for example, a direct evaporative cooler that includes a wetted media. The mechanical cooling system may be, for example, an air-conditioning refrigerant system. The adiabatic system and mechanical system may be selectively employed and adjusted based on established control conditions. The mechanical cooling system may cool the supply air directly, indirectly (e.g., by chilling water that has been circulated through an air handling system), or a combination thereof. In certain embodiments, a cooling system may include an evaporative cooling system (direct or indirect) upstream from a mechanical cooling system in lieu of, or in addition to, an evaporative cooling system (direct or indirect) downstream from the mechanical system.

Table 1 is an example of operating modes for a cooling system. In this example, the cooling mode at any given time is based on the conditions of outside air and the air at selected locations in the cooling system.

TABLE 1

Example of Cooling Modes for Air Handlers

Mode 1: Economizer

Control Conditions

| | | |
|---|---|---|
| Ambient Temperature: | <minimum set point | (typically 72° F.) |
| Supply Air Enthalpy: | <set point | (typically >30) |
| Cooling Systems | | |
| Outside Air | Damper controlled | |
| Re-Circulation System | Damper controlled | |
| Adiabatic System | Humidity control | |
| Mechanical System | Off | |

Notes

In this example, in the Economizer Mode, the system mixes cooler ambient air and blends it with heated return air from the data room to achieve the desired supply air set point temperature. If the return air relative humidity is below the minimum, the adiabatic system will adjust the humidity up. There is no Mechanical cooling. The conditions for this mode are that the ambient temperature is less than the low end of the desired set-point (typically 72° F.). Tight control of relative humidity may not be required on the high end because a constant heat source (servers) is provided that inhibits condensation.

Mode 2: Free-Cooling Mode

Control Conditions

| | | |
|---|---|---|
| Ambient Temperature: | Set point ± control band | (typically 76 ± 4° F.) |
| Ambient Air Relative Humidity: | >minimum set point | (typically >20%) |
| Return Air Relative Humidity: | >minimum set point | (typically >20%) |
| Supply Air Enthalpy: | <set point | (typically >30) |
| Cooling Systems | | |

TABLE 1-continued

| | |
|---|---|
| Outside Air | Open |
| Re-Circulation System | Closed |
| Adiabatic System | Off |
| Mechanical System | Off |

Notes

In this example, in Free-Cooling Mode the system utilizes 100% outside air to cool th edata center. All the return air is exhausted to atmosphere. No Mechanical or Evaporative cooling is required. The conditions for this mode are that the ambient temperature is within the set point control band. (typically 76 ± 4° F.). Tight control of maintaining a high humidity level may not be required because a large portion of the return air can be exhausted so no water build-up occurs, and because a constant heat source (servers) is provided that inhibit condensation.

Mode 3: Adiabatic Mode

Control Conditions

| | | |
|---|---|---|
| Ambient Temperature: | >maximum set point | (typically >80° F.) |
| Supply Air Enthalpy: | <set point | (typically >30) |
| Cooling Systems | | |
| Outside Air | Damper controlled | |
| Re-Circulation System | Damper controlled | |
| Adiabatic System | On - controlled | |
| Mechanical System | Off | |

Notes

In this example, Adiabatic Mode is similar to Free-Cooling Mode as the system mainly utilizes outside air, however it differs in that the evaporative cooling system comes on line as a cooling source. No Mechanical cooling is required. Humidity control may be carried out in this mode. If the return air relative humidity falls below the minimum set point (typically 20%), a portion of the heated (damp) return air may be blended back to the supply air to bring the relative humidity up to within set control limits. As with the Free Cooling Mode, tight control of maintaining a high humidity level may not be required, however, because a large portion of the return air can be exhausted so no water build-up occurs, and because a constant heat source (servers) is provided that inhibits condensation.

Mode 4: Hybrid Mode

Control Conditions

| | | |
|---|---|---|
| Ambient Temperature: | >maximum set point | (typically >80° F.) |
| Supply Air Enthalpy: | >set point | (typically >30) |
| Cooling Systems | | |
| Outside Air | Damper controlled | |
| Re-Circulation System | Damper controlled | |
| Adiabatic System | On | |
| Mechanical System | On | |

Notes

In this example, Hybrid Mode is similar to Adiabatic Mode as the system mainly utilizes only outside air and the adiabatic system; however, the mechanical systems also come on line. Mechanical systems cool the blended supply air temperature to within the parameters of Mode 3 - Adiabatic Mode. The adiabatic system cools the supply air to within the temperature set points. If the return air relative humidity falls below the minimum set point (typically 20%), a portion of the heated (damp) return air is blended back to the supply air to bring the relative humidity up to within set control limits. As with the Fee Cooling Mode, tight control of maintaining a high humidity level may not be required because a large portion of the return air can be exhausted so no water build-up occurs, and because a constant heat source (servers) is provided that inhibits condensation.

Mode 5: Mechanical Mode

Control Conditions

| | | |
|---|---|---|
| Ambient Temperature: | >maximum set point | (typically >80° F.) |
| Ambient Relative Humidity: | >maximum set point | (typically >80%) |
| Enthalpy: | >set point | (typically >30) |
| OR | | |
| Outside air is unusable. | | |
| Cooling Systems | | |

TABLE 1-continued

| | |
|---|---|
| Outside Air | Closed |
| Re-Circulation System | Open |
| Adiabatic System | Off |
| Mechanical System | On |

Notes
In this example, Mechanical Mode may include recirculation of all air such that no outside air is used. The air may be cooled to within the temperature set point by passing it across mechanically cooled coils. When this mode is relied upon, the mechanical cooling plant is preferably sized to cool the entire heat load. Humidity is monitored and controlled. The system may be operated in this mode when the wet bulb temperature is above the desired temperature control set point or if outside air is unusable. As used herein, "unusable" refers to air that contains an unacceptable of contaminants, such as airborne matter from agricultural or industrial processes.

Although the example Table 1 describes five different modes, it will be understood that in various embodiments, a cooling system may operate in only some of the modes described in Table 1. For example, a cooling system may operate in only an adiabatic mode and a hybrid mode. In addition, a cooling system may in various embodiments operate in modes in addition to those described above. The control conditions, sources of air, measured values, and various operating parameters in the various modes in the example in Table 1 for illustrative purposes only, and in various embodiments may include different control conditions, set points, and operating parameters.

Figure 2:
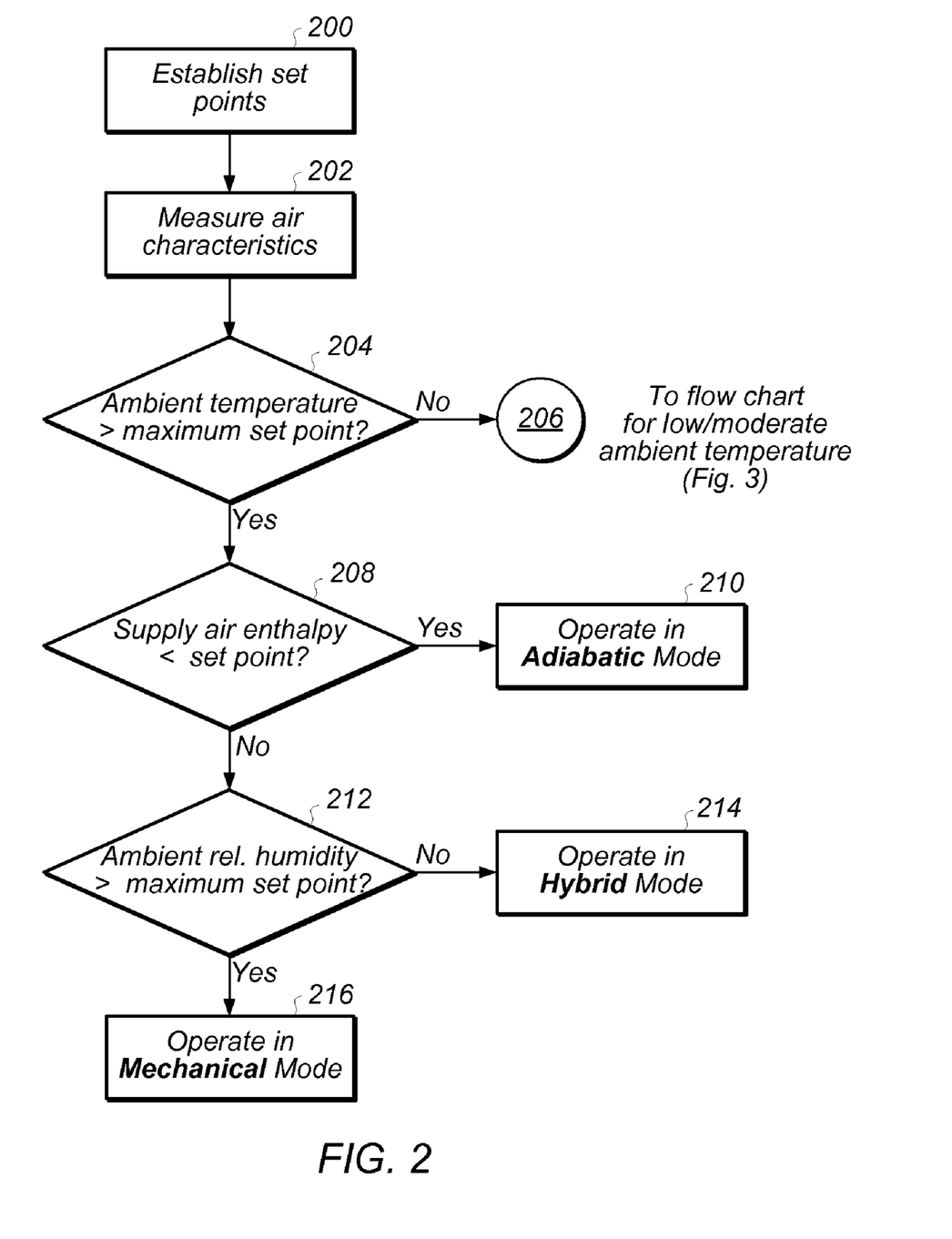
FIGS. 2 and 3 are flow diagrams illustrating one embodiment of operating a cooling system in multiple modes.
Figure 3:
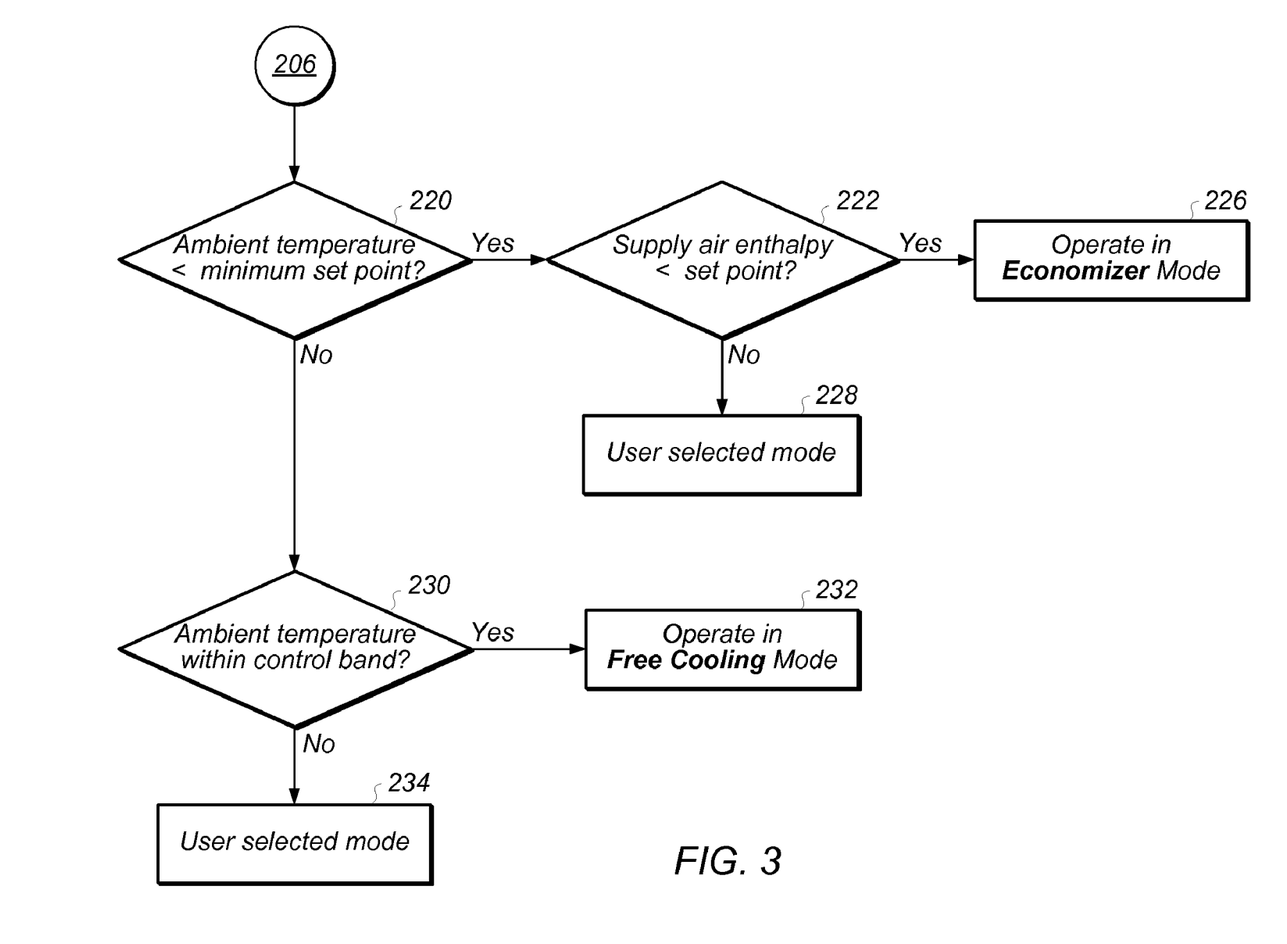

FIGS. 2 and 3 are flow diagrams illustrating one embodiment of operation of a multi-mode cooling system. Multi-mode operation of a cooling system such as described above may be accomplished automatically, manually, or a combination thereof. In certain embodiments, switching between modes may be accomplished with an automatic controller such as described above relative to FIG. 1. At 200, set points are established for control conditions. At 202, characteristics of air are measured. Measurements such as dry bulb temperature, wet bulb temperature, humidity, and pressure may be taken for outside air, supply air, return air, or at any other location.

At 204, the measured ambient temperature is compared to the established ambient temperature maximum set point. If the ambient temperature is greater than the maximum set point, the supply air enthalpy may be determined and compared to an established supply air enthalpy set point. If the supply air enthalpy is below the set point, the system may be operated in an adiabatic mode at 210. The adiabatic mode may employ only the evaporative cooling system, without any mechanical cooling. In certain embodiments, different properties, such as wet bulb temperature, may be used as control conditions instead of, or in addition to, enthalpy.

If the measured supply air enthalpy is equal to or greater than the supply air enthalpy set point at 208, the ambient relative humidity is compared to a maximum relative humidity set point at 212. If the ambient relative humidity is equal to or less than the maximum relative humidity set point, the system may be operated in a hybrid mode at 214. In the hybrid mode, both the evaporative cooling system and the mechanical cooling system may be operated to cool the supply air to the data center.

If the ambient relative humidity is above the maximum relative humidity set point, the system may be operated in a mechanical mode at 216. In the mechanical mode, the system may employ only the mechanical cooling system, with the evaporative cooling system being disabled and/or bypassed.

Referring again to 204, if the ambient temperature is less than or equal to the ambient temperature maximum set point, conditions for low/moderate temperatures may be evaluated at 206, the details of which are illustrated on FIG. 3. At 220, the ambient temperature is compared to a ambient temperature minimum set point. If the ambient temperature set point is below the ambient temperature minimum set point, a measured supply air enthalpy may be compared to a supply air enthalpy set point at 222. If the measured supply air enthalpy is less than the set point, the system may be operated in an economizer mode. In the economizer mode, an adiabatic system may be operated to control humidity. An economizer mode may be used, for example, when the weather is cold and dry. If the supply air enthalpy is at or below the set point, a user may select the operating mode at 228.

If the ambient temperature is at or above the ambient temperature minimum set point at 220, the ambient temperature is compared to a defined temperature control band (e.g., 76±4° F.). If the ambient temperature is within the control band, the system may be operated in free cooling mode at 232. In the free cooling mode, outside air may be channeled through the air handling system and supplied to the data center while the adiabatic system and mechanical systems are off or disengaged. Air from the data center may be exhausted to the outside. If the ambient temperature is not within the control band, a user may select the operating mode at 234.

Figure 4:
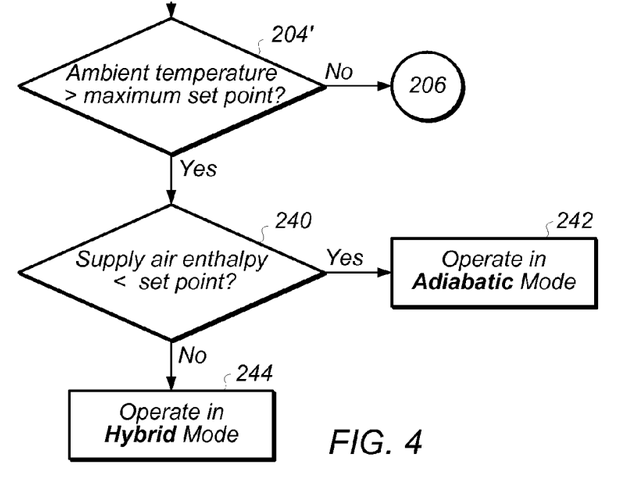
FIG. 4 illustrates is a flow diagram illustrating an alternate embodiment of determining an operating mode for ambient temperatures above an maximum ambient temperature set point.

FIG. 4 illustrates is a flow diagram illustrating an alternate embodiment of determining an operating mode where ambient temperatures are above the maximum ambient temperature set point. As in FIG. 2, set points may be established and air characteristics measured. At 204', the supply air enthalpy is compared to the set point. If the measured supply air enthalpy is below the set point, the system is operated in an adiabatic mode. If measured supply air enthalpy is at or above the set point, the system is operated in hybrid mode. Thus, in contrast to the embodiment shown in FIG. 2, the adiabatic system may remain operational (i.e., in both the adiabatic mode and the hybrid mode) regardless of the relative humidity conditions of the ambient air.

Figure 5:
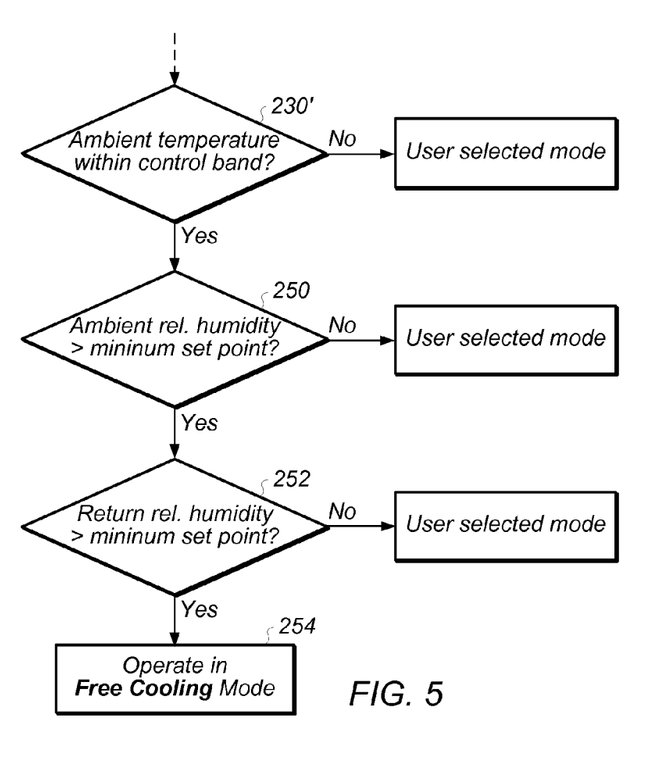
FIG. 5 illustrates is a flow diagram illustrating an alternate embodiment of determining conditions for operating in a free cooling mode.

FIG. 5 illustrates is a flow diagram illustrating an alternate embodiment of determining conditions for operating in a free cooling mode. The steps prior to 230' may be the same as shown in FIGS. 2 and 3. At 230', the ambient temperature is compared to a defined temperature control band. If the ambient temperature is within the control band, the relative humidity of the ambient air is compared to a minimum set point at 250. If the relative humidity of the ambient air is above the minimum set point, the relative humidity of the return air is compared to a minimum set point at 252. If the relative humidity of the return air is above the minimum set point at 252, then the system is operated in free cooling mode. Thus, in contrast with the embodiment shown in FIG. 3, the free cooling mode is used only after it is determined that the ambient air and the return air are above a threshold humidity level.

Figure 6:
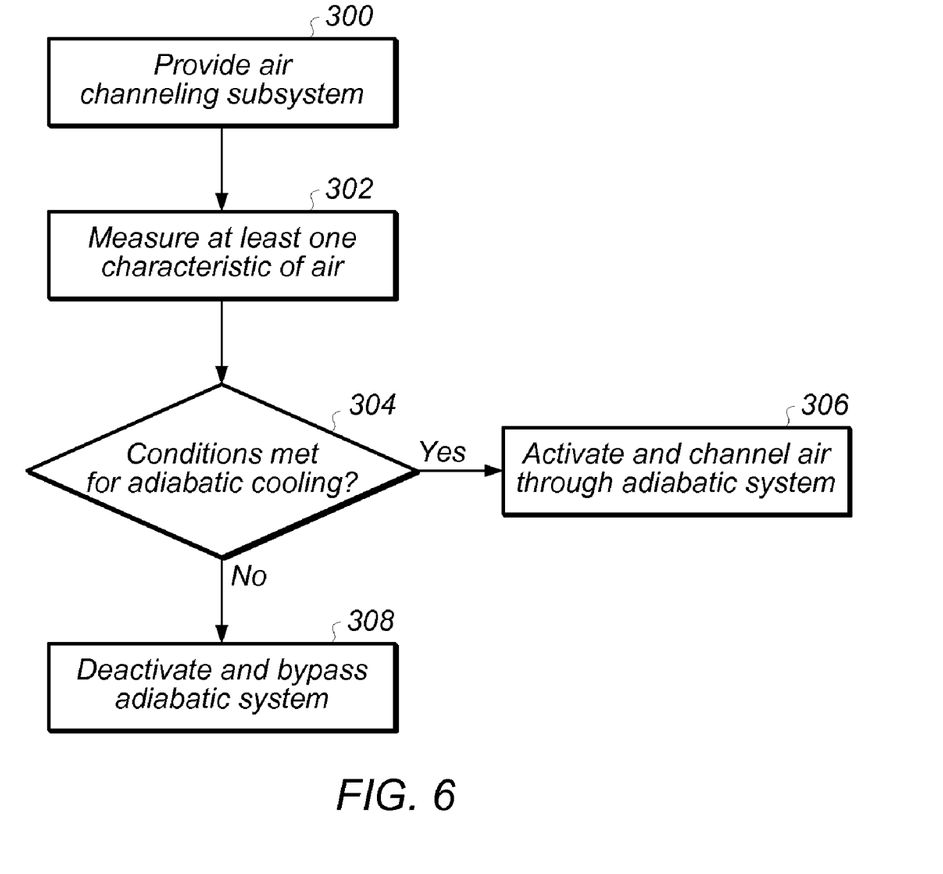
FIG. 6 is a flow diagram illustrating one embodiment of operating a cooling system having an adiabatic system bypass.

As illustrated in FIG. 1 above, a multi-mode cooling system may in some embodiments provide for bypass of an adiabatic system. The adiabatic system may be bypassed in those modes in which adiabatic cooling is not used. FIG. 6 illustrates operation of a cooling system with selective bypass of an adiabatic system. At 300, one or more air handling systems are provided. At 302, one or more control conditions are measured. At 304, control conditions are evaluated. If the control conditions are met, air is passed through the adiabatic system and the adiabatic system activated to cool the supply air at 306. As an example, air may be passed through the adiabatic system and the adiabatic system may be operated if the ambient air temperature exceeds a maximum set point and the supply air enthalpy is less than a supply air enthalpy set point (such as described above with respect to "Mode 3: Adiabatic Mode").

If the control conditions are not met or if a second set of control conditions is met, the adiabatic system may be bypassed at 308. For example, if conditions indicate that sufficient cooling can be achieved in a free cooling mode, the adiabatic system may be placed in bypass. To bypass evaporative cooler 136 in cooling system 100 shown in FIG. 1, for example, evaporative cooler bypass damper 141 may be opened and evaporative cooler face damper 142 may be closed. Subsequently, to re-enter a mode that uses the adiabatic system, the damper positions may be reversed such that evaporative cooler bypass damper 141 is closed and evaporative cooler face damper 142 is opened. In certain embodiments, the system may be operated with the evaporative cooler bypass damper 141 and/or evaporative cooler face damper 142 in partially open positions.

Although in the flow charts shown in FIGS. 2-6, control conditions are assessed in a particular sequence, it will be understood that in other embodiments the sequence may be different. In addition, the control conditions may be monitored over time (continuously or at regular or irregular intervals), and mode switching accomplished based on changes in the conditions.

Figure 7A:
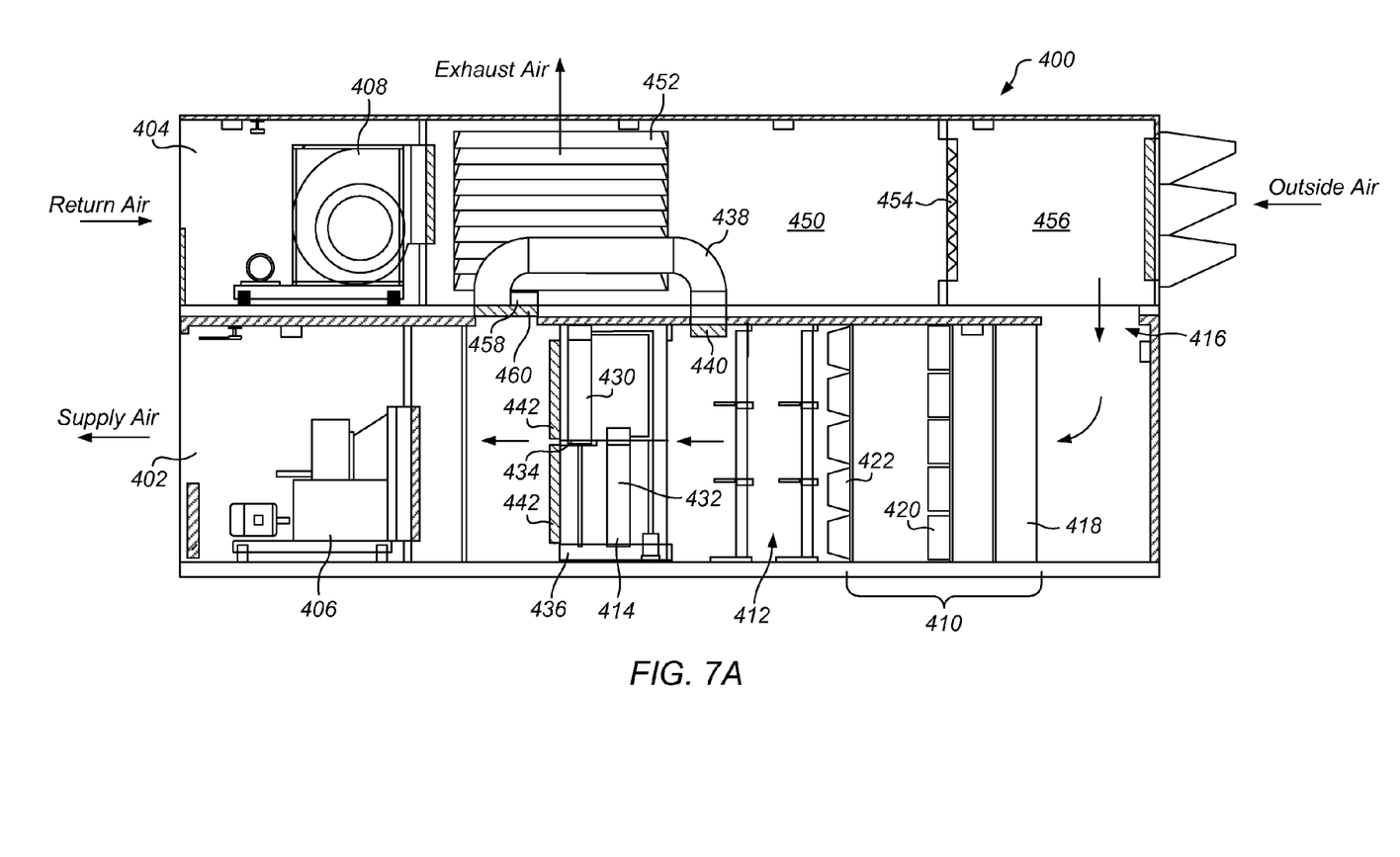
FIG. 7A is a side elevation view of one embodiment of an air handling system including a mechanical system and an adiabatic system.
Figure 7B:
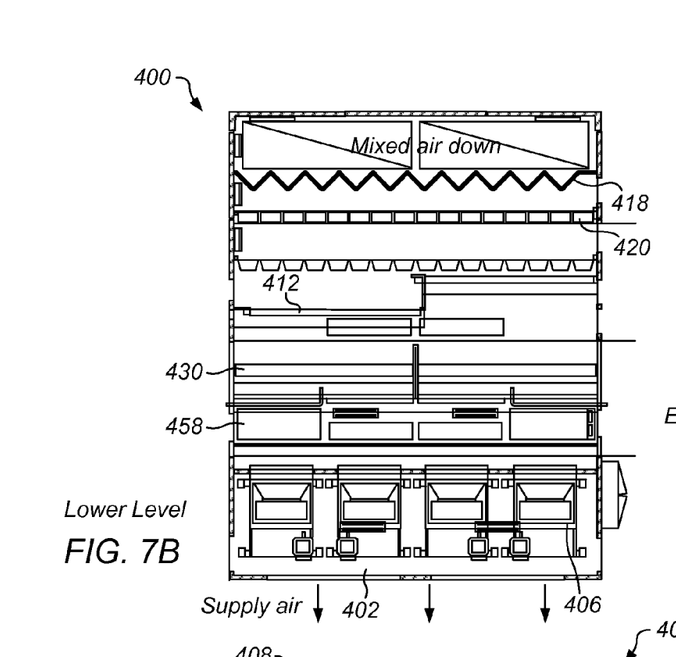
FIG. 7B is a plan view of the lower level of the air handling system shown in FIG. 7A.
Figure 7C:
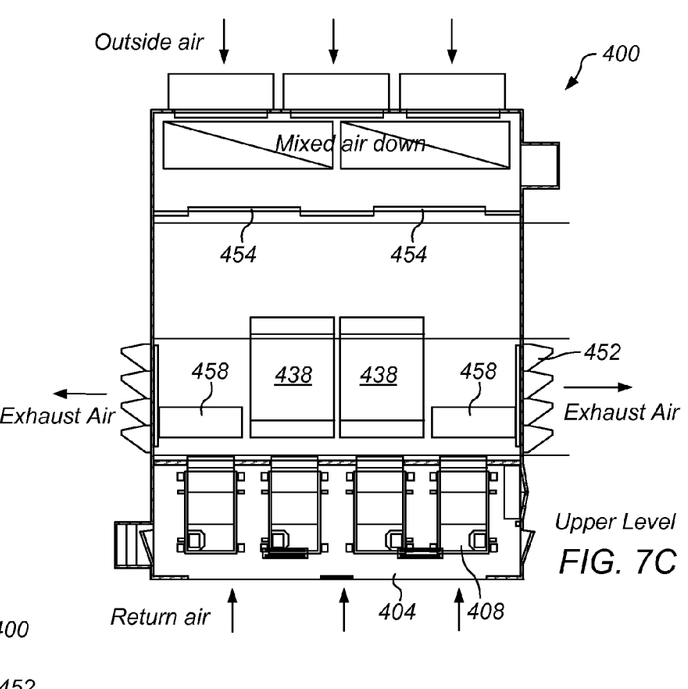
FIG. 7C is a plan view of the upper level of the air handling system shown in FIG. 7A.
Figure 7D:
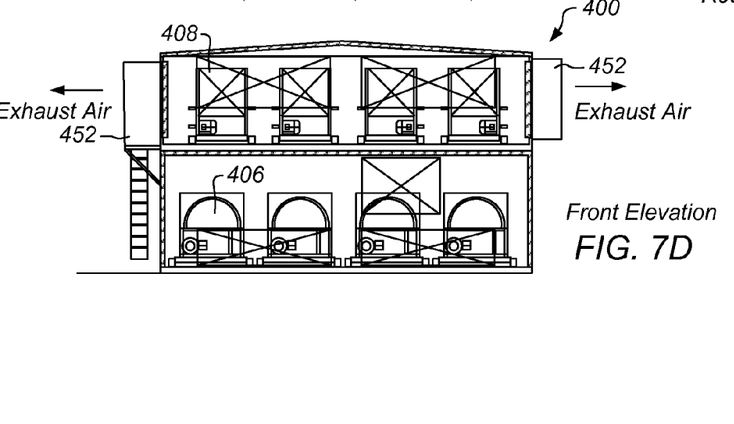
FIG. 7D is a front elevation view of the air handling system shown in FIG. 7A.

FIGS. 7A-7D illustrate an embodiment of air handling unit including a mechanical cooling section and an evaporative cooling section. FIG. 7A is a side elevation view of the air handling system. FIG. 7B is a plan view of the lower level of the air handling system. FIG. 7C is a plan view of the upper level of the air handling system. FIG. 7D is a front elevation view of the air handling system.

Air handling system 400 provides supply air to a data center through supply vent 402 and receives return air from the data center through return vent 404. Air handling system 400 includes supply fans 406, return fans 408, filters 410, chilled water cooling coils 412, and evaporative cooling system 414. Supply fans 406 channels air from air handling system 400 into the data center through supply vent 402 on the lower level of air handling system 400. Return fans 408 channel air from the data center to air handling system 400 through return vent 404 on the upper level of air handling system 400.

In one embodiment, supply fans 406 are 180,000 cubic feet per minute, QEP-54 manufactured by Greenheck. In one embodiment, return fans 408 are 180,000 cubic feet per minute, ATLI 0-40T2 manufactured by Comefri.

Air to be supplied to the data center is forced downward from the upper level through opening 416 and then through filters 410. Air is forced successively through pre-filter 418, final filter 420, and carbon filter 422. In one embodiment, pre-filter 418 is a two-inch pleated 30% filter manufactured by Airguard. In one embodiment, final filter 420 is a 12-inch 95% filter manufactured by Airguard. In one embodiment, carbon filter 422 is a 12-inch high mass bonded carbon filter manufactured by Sparks.

After exiting filter 422, air is forced across chilled water cooling coils 412. Chilled water cooling coils 412 remove heat from the air as it passes over the coils.

Evaporative cooler 414 includes upper evaporative media bank 430, lower evaporative media bank 432, intermediate sump 434, and bottom sump 436. In one embodiment, the evaporative media is Celdek media manufactured by Munters Corporation.

Air handling system 400 includes evaporative cooler bypass duct 438, evaporative cooler bypass damper 440, and evaporative cooler face dampers 442. Depending on the mode of operation, air that has passed over cooling chilled water cooling coils 412 is either forced through evaporative media in evaporative cooler 414, through evaporative cooler bypass duct 438, or a combination thereof. In one embodiment, the evaporative cooler face velocity is about 652 feet per minute, based on a flow rate of 180,000 cubic feet per minute.

In certain embodiments, the evaporative cooling system may be operated using only one of the evaporative media banks (e.g., upper evaporative media bank 430) while the flow through the other evaporative media banks (e.g., lower evaporative media bank 432) is inhibited. Air from evaporative cooler 414 may be channeled through supply vent 402 to one or more rooms of a data center.

Return air from the data center may be received in return air chamber 450. In some embodiments, air in return air chamber 450 may be exhausted to the outside through exhaust vents 452. In other embodiments, mixing air dampers 454 may be operated to allow some or all of the return air to mix with incoming outside air in mixing region 456. In certain embodiments, air in return air chamber 450 is forced through return air bypass 458. Flow through return air bypass 458 may be controlled by return air bypass dampers 460.

Figure 8:
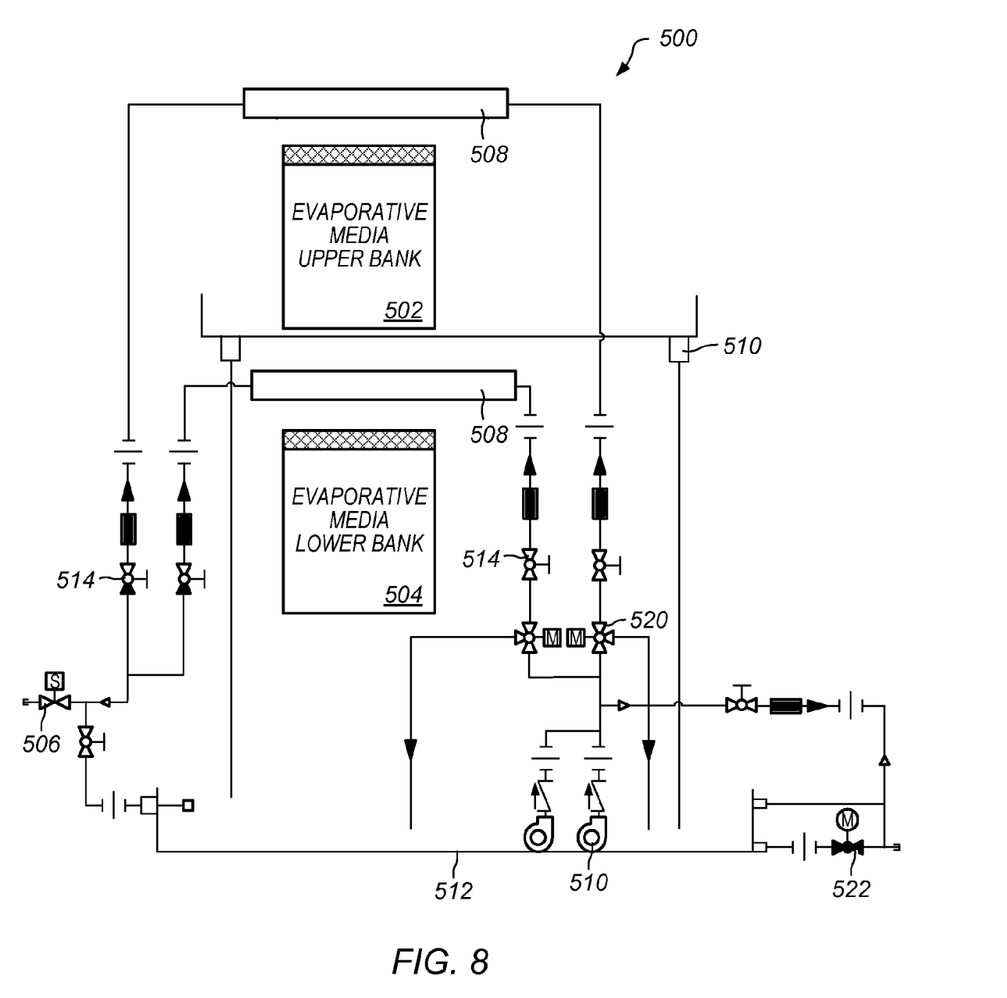
FIG. 8 is a schematic diagram of an evaporative cooling system according to one embodiment.

FIG. 8 is a fluid schematic diagram illustrating one embodiment of an evaporative cooling system including upper and lower evaporative media banks. Evaporative cooling system 500 includes evaporative media upper bank 502 and evaporative media lower bank 504. Supply from a domestic water supply is provided through supply valve 506. Water is fed to each of evaporative media upper bank 502 and evaporative media lower bank 504 through distribution manifolds 508. Water may also be supplied to distribution manifolds 508 from bottom sump 512 using pumps 510. Balancing valves 514 may be controlled to balance flow to manifolds 508 and/or water levels in the media. Water may be recirculated to sump 512 using three-way valves 520. Water may be expelled or removed from the system through drain valve 522.

In certain embodiments, operation of one or more of sub-systems (e.g., CRACs) may be controlled to increase or decrease the total output of the cooling system. In certain embodiments, the number of units switched from normal to free cooling mode may be selected to achieve a desired level of cooling performance. In some embodiments, switching between outside air and return air and/or shut down of the chillers may be programmed to occur in stages.

In some embodiments, air handling sub-systems may be used to remove smoke from a data center. In one embodiment, a system includes smoke detection devices in the data center. When smoke is detected by one of the devices, some or all of the air handling sub-systems are switched to outside air. Exhaust dampers may be opened to allow smoke to be purged or extracted from the data center. In one embodiment, all of air handling sub-systems that have outside air dampers are fully opened to remove smoke from the data center.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for cooling computer systems in a room of a data center, comprising:
providing one or more air channeling sub-systems, at least one of the air channeling sub-systems comprising a mechanical cooling section and a direct evaporative cooling section;

channeling cooling air through the one or more air channeling sub-systems and into the room, wherein channeling cooling air through the air channeling sub-systems comprises:

operating at least one of the air channeling sub-systems in an adiabatic mode if a first set of control conditions is met, wherein operating in the adiabatic mode comprises channeling cooling air through the direct evaporative cooling section to evaporate water into the cooling air; and operating at least one of the air channeling sub-systems in a hybrid mode if a second set of control conditions is met, wherein operating in the hybrid mode comprises channeling cooling air through the mechanical cooling section to remove heat from the cooling air and channeling the cooling air through the direct evaporative cooling section to evaporate water into the cooling air.

2. The method of claim 1, further comprising:
selecting an ambient air temperature maximum set point and a supply air enthalpy set point;
measuring a temperature of ambient air;
measuring at least one characteristic of supply air to the room; and
determining an enthalpy of the supply air into the data room from the at least one characteristic of the supply air into the room;
wherein in the first set of control conditions is met if the measured ambient air temperature is at or above the ambient air temperature maximum set point and the supply air enthalpy is at or below the supply air enthalpy set point;
wherein the second set of control conditions is met if the measured ambient air temperature is at or above the ambient air temperature maximum set point and the supply air enthalpy is above the supply air enthalpy set point.

3. The method of claim 1, wherein operating the at least one of the air channeling sub-system in the adiabatic mode further comprises blending at least a portion of return air from the room with outside air to generate the supply air.

4. The method of claim 1, wherein operating the at least one of the air channeling sub-system in the adiabatic mode further comprises blending at least a portion of return air from the room with outside air to generate the supply air to bring the relative humidity of the supply air within set control limits.

5. The method of claim 1, wherein operating the at least one of the air channeling sub-system in the hybrid mode further comprises blending at least a portion of return air from the room with outside air to generate the supply air to bring the relative humidity of the supply air within set control limits.

6. The method of claim 1, wherein operating the at least one of the air channeling sub-system in the hybrid mode further comprises controlling at least one operating characteristic of the evaporative cooling section to maintain the supply air within a desired temperature control band.

7. The method of claim 1, further comprising operating at least one of the air channeling sub-systems in an economizer mode if a third set of control conditions is met, wherein operating in the economizer mode comprises:
channeling cooling air through the direct evaporative cooling section to evaporate water into the cooling air; and
controlling a humidity of supply air to the data room by controlling an amount of water evaporated into the cooling air in the direct evaporative cooling section.

8. The method of claim 7, wherein the third set of control conditions is met if the measured ambient air temperature is below an ambient air temperature minimum set point and the supply air enthalpy is below the supply air enthalpy set point.

9. The method of claim 7, wherein operating the at least one of the air channeling sub-systems in the economizer mode further comprises blending at least a portion of return air from the room with outside air to generate the supply air to bring the relative humidity of the supply air within set control limits.

10. The method of claim 1, further comprising operating at least one of the air channeling sub-systems in a free cooling mode if a fourth set of control conditions is met, wherein operating in the free cooling mode comprises:
shutting down or inhibiting operation of the mechanical cooling section and the direct evaporative cooling section;
channeling air from the outside through the room while the mechanical cooling section and the direct evaporative cooling section are shut down or inhibited from operation; and
exhausting air from the room to the outdoors.

11. The method of claim 10, wherein the fourth set of control conditions is met if the ambient air temperature is within a desired temperature control band.

12. The method of claim 10, wherein the fourth set of control conditions is met if the ambient air temperature is within a control band and the ambient air relative humidity is above a minimum set point.

13. The method of claim 10, wherein the fourth set of control conditions is met if the ambient air temperature is within a control band, the ambient air relative humidity and the return air relative humidity are above a minimum set point, and the enthalpy of the supply air into the room is below the supply air enthalpy set point.

14. The method of claim 10, wherein inhibiting operation of the direct evaporative cooling section comprises routing the cooling air to bypass the direct evaporative cooling section.

15. The method of claim 1, further comprising operating at least one of the air channeling sub-systems in a mechanical mode if a fifth set of control conditions is met, wherein operating in the mechanical mode comprises channeling cooling air through the mechanical cooling section to remove heat from the cooling air, wherein the cooling air is recirculated from the room.

16. The method of claim 15, wherein the fifth set of control conditions is met if the measured outside ambient temperature is above an ambient temperature maximum set point, the ambient relative humidity is above an ambient relative humidity set point, and the supply air enthalpy is above an enthalpy set point.

17. The method of claim 15, wherein the fifth set of control conditions is met if the outside air is unusable.

18. The method of claim 1, wherein the direct evaporative cooling section is downstream from the mechanical cooling section.

19. The method of claim 1, further comprising modulating at least one of an outside air damper and a return air damper in at least one of the air channeling sub-systems to control the proportions of return air and outside air.

20. The method of claim 1, further comprising modulating one or more return air dampers to selectively allow recirculation of cooling air from the room.

21. The method of claim 1, further comprising controlling at least one of the air channeling sub-systems to maintain at least one temperature in the data center within a predetermined range.

22. A system for cooling computer systems in a room of a data center, comprising:
- one or more air channeling sub-systems, at least one of the air channeling sub-systems comprising:
  - a mechanical cooling section one or more air channeling sub-systems configured to remove heat from the cooling air; and
  - a direct evaporative cooling section downstream from the mechanical cooling section;
- a controller coupled to the mechanical cooling section and the direct evaporative cooling section, the controller configured to selectively operate the mechanical cooling section and the direct evaporative cooling section in an adiabatic mode if a first set of control conditions is met and in a hybrid mode if a second set of control conditions is met;
- wherein operating in the adiabatic mode comprises channeling cooling air through the direct evaporative cooling section to evaporate water into the cooling air; and
- wherein operating in the hybrid mode comprises channeling cooling air through the mechanical cooling section to remove heat from the cooling air and channeling the cooling air through the direct evaporative cooling section to evaporate water into the cooling air.

23. The system of claim 22, further comprising a bypass of the direct evaporative cooling section, wherein the bypass comprises at least one damper coupled to the controller to regulate the flow of air through the direct evaporative cooling section.

24. The system of claim 22, wherein the mechanical cooling section comprises a chilled water system.

25. The system of claim 22, further comprising at least one air filter upstream from the mechanical cooling section.

26. The system of claim 22, further comprising, upstream from the mechanical cooling section, at least one pre-filter, at least one final filter, and at least one final filter.

27. The system of claim 22, wherein the controller is further configured to modulate an outside air damper and a return air damper in at least one of the air channeling sub-systems to control the proportions of return air and outside air.

28. The system of claim 22, further comprising one or more return air dampers configured to selectively allow recirculation of cooling air from the room.

29. The system of claim 22, further comprising:
- at least one sensor configured to measure at least one characteristic of outside air; and
- wherein the controller is configured to at least partially open the outside air dampers of at least one of the air channeling sub-systems based on at least one predetermined characteristic of the outside air.

30. The system of claim 22, further comprising at least one temperature sensor in the data center, wherein the controller is in data communication with the at least one temperature sensor in the data center, wherein the controller is configured to control the one or more air channeling sub-systems to maintain at least one temperature in the data center within a predetermined range.

31. The system of claim 22, further comprising:
- a bypass duct configurable to channel the cooling air to bypass the direct evaporative cooling section; and
- one or more dampers configurable to direct at least a portion of the cooling air through the bypass duct instead of the direct evaporative cooling section.

32. The system of claim 22, wherein the controller is configured to control the one or more air channeling sub-systems to maintain at least one temperature in the data center within a predetermined range.

33. The system of claim 22, further comprising one or more dampers configured to at least partially inhibit air flow through the direct evaporative cooling section.

34. The system of claim 22, wherein the controller is further configured to:
- select an ambient air temperature maximum set point and a supply air enthalpy set point;
- measure a temperature of ambient air;
- measure at least one characteristic of supply air to the room; and
- determine an enthalpy of the supply air into the data room from the at least one characteristic of the supply air into the room;
- wherein in the first set of control conditions is met if the measured ambient air temperature is at or above the ambient air temperature maximum set point and the supply air enthalpy is at or below the supply air enthalpy set point;
- wherein the second set of control conditions is met if the measured ambient air temperature is at or above the ambient air temperature maximum set point and the supply air enthalpy is above the supply air enthalpy set point.

35. The system of claim 22, wherein the controller is further configured to blend at least a portion of return air from the room with outside air to generate the supply air.

36. The system of claim 22, wherein the controller is further configured to blend at least a portion of return air from the room with outside air to generate the supply air to bring the relative humidity of the supply air within set control limits.

37. The system of claim 22, wherein the controller is further configured to control at least one operating characteristic of the evaporative cooling section to maintain the supply air within a desired temperature control band.

38. The system of claim 22, wherein the controller is further configured to:
- shut down or inhibit operation of the mechanical cooling section and the direct evaporative cooling section, and
- channel air from outside through the room while the mechanical cooling section and the direct evaporative cooling section are shut down or inhibited from operation.

* * * * *